US007817420B2

(12) United States Patent
Drummy et al.

(10) Patent No.: US 7,817,420 B2
(45) Date of Patent: Oct. 19, 2010

(54) PORTABLE ENVIRONMENTALLY ROBUST ENCLOSURE OPTIMIZED FOR SIZE, WEIGHT, AND POWER DISSIPATION

(75) Inventors: Michael Drummy, North Reading, MA (US); Ronald S Collicutt, Northbridge, MA (US)

(73) Assignee: Olympus NDT, Waltham, MA (US)

( * ) Notice: Subject to any disclaimer, the term of this patent is extended or adjusted under 35 U.S.C. 154(b) by 276 days.

(21) Appl. No.: 12/194,652

(22) Filed: Aug. 20, 2008

(65) Prior Publication Data
US 2010/0044008 A1 Feb. 25, 2010

(51) Int. Cl.
H05K 7/20 (2006.01)
(52) U.S. Cl. .............. 361/695; 361/690; 361/704; 361/707; 361/719; 361/721; 174/16.1; 174/16.3; 165/80.3
(58) Field of Classification Search .............. None
See application file for complete search history.

(56) References Cited

U.S. PATENT DOCUMENTS

| 5,111,362 A * | 5/1992 | Flamm et al. ............... 361/736 |
| 6,065,530 A * | 5/2000 | Austin et al. ............... 165/80.3 |
| 6,411,514 B1 * | 6/2002 | Hussaini .................. 361/704 |
| 6,678,181 B2 * | 1/2004 | Karol et al. ............... 363/141 |
| 6,867,963 B2 * | 3/2005 | Staiano .................. 361/679.34 |
| 7,330,356 B2 * | 2/2008 | Park ............................ 361/720 |
| 7,450,382 B1 * | 11/2008 | Fischer et al. ............... 361/695 |
| 7,460,367 B2 * | 12/2008 | Tracewell et al. ........ 361/679.48 |
| 2009/0103267 A1 * | 4/2009 | Wieland et al. ............. 361/707 |

* cited by examiner

Primary Examiner—Boris L Chervinsky
(74) Attorney, Agent, or Firm—Ostrolenk Faber LLP

(57) ABSTRACT

An enclosed electronic apparatus including a first continuous heat-transfer band forming at least a portion of the exterior surface of the enclosure, with continuous lateral edges on either side thereof, and mounting points on an internal side of the continuous heat transfer band to which a printed circuit board assembly is mountable. A printed circuit board assembly is mounted to the heat transfer band at the mounting points, with a thermally conductive portion forming a thermal path between a heat-producing electronic component of the printed circuit board assembly and the heat transfer band. A thermally conductive gasket between the printed circuit board assembly and the heat transfer band at the mounting points facilitates heat transfer. Opposing first and second enclosure portions seal the respective continuous lateral edges of the heat transfer band against penetration of fluid or debris. It is small, compact, lightweight, rugged and otherwise ergonomic for ease of use and protection from accidental impact caused by, for example, dropping the unit. The reliability of the system is improved because the internal electronic components are protected from moisture, dust, and other liquid or particle contaminants, all while maintaining an internal temperature that is lower than a maximum permissible operating temperature.

22 Claims, 14 Drawing Sheets

PORTABLE ENVIRONMENTALLY ROBUST ENCLOSURE OPTIMIZED FOR SIZE, WEIGHT, AND POWER DISSIPATION

BACKGROUND OF THE INVENTION

Field of the Invention

The present invention relates to the field of electronics packaging, and more particularly to a robust enclosure having reduced size and weight and increased power dissipation capacity.

SUMMARY OF THE INVENTION

It is an object of the present invention to provide an enclosed electronic apparatus including a first continuous heat-transfer band forming at least a portion of the exterior surface of the enclosure, with continuous lateral edges on either side thereof, and mounting points on an internal side of the continuous heat transfer band to which a printed circuit board assembly is mountable. A printed circuit board assembly is mounted to the heat transfer band at the mounting points, with a thermally conductive portion forming a thermal path between a heat-producing electronic component of the printed circuit board assembly and the heat transfer band. An optional thermally conductive gasket between the printed circuit board assembly and the heat transfer band at the mounting points facilitates heat transfer. Opposing first and second enclosure portions seal the respective continuous lateral edges of the heat transfer band against penetration of fluid or debris.

The enclosed electronic apparatus may include more than one continuous heat-transfer bands, while maintaining the sealed integrity of the enclosure. The plural continuous heat transfer bands may be sequentially located adjacent each other, including a thermally conductive gasket between them, or they may have additional enclosure section interposed between them, again with optional continuous gaskets for sealing.

The enclosed electronic apparatus may include one or more printed circuit board assemblies, either mounted in a generally continuous plane or mounted in respective offset planes. A fan may be provided to circulate coolant fluid, e.g., air, over the surface of the at one or more printed circuit board assemblies.

The enclosure may optionally includes one or more of an integral graphical user interface, a user keypad, an encoder knob, and sealed access doors for communication ports and/or an internal battery. The graphical user interface would be viewable through a sealed transparent window in the enclosure, and may itself be in thermal communication with the continuous heat transfer band to dissipate heat generated by its operation within the enclosure. Access doors, such as for battery access or communication access are preferably sealed by continuous gaskets, and selectively securely held in their closed position to maintain the integrity of the enclosure.

In the case where an encoder knob is provided, an encoder shaft opening in the enclosure admits the shaft of an encoder mounted with the electronic apparatus. A continuous shaft gasket in compression between the encoder shaft and the encoder shaft opening. The encoder knob is mounted to the encoder shaft, and preferably covers the area of encoder shaft opening. A sealing grease may be applied to the interface between the encoder shaft opening and the continuous shaft gasket, and to the interface between the continuous shaft gasket and the encoder shaft. Preferably, the encoder knob presents a small clearance between itself and the surface of the respective enclosure, and/or a small clearance between itself and a wall of the encoder shaft opening, both to inhibit penetration of external fluid or debris.

According to the present disclosure, a plurality of shock resisting bumpers may be secured to an exterior of the electronic apparatus, such that a linear surface between any two adjacent shock resisting bumpers would contact only the bumpers, and not any other part of the apparatus. Where the apparatus is generally the shape of a rectangular parallelepiped, the plurality of shock resisting bumpers are preferably positioned to cover at least the eight corners of the rectangular parallelepiped. Shock resisting bumpers may also protect a protrusion of a compartment extending from the enclosure.

The printed circuit board assembly may optionally, include a heat conducting covering in thermal contact with an exposed surface of a heat generating component of the PCB assembly, and connected to the continuous heat transfer band, forming a further thermal path between the heat generating component and the continuous heat transfer band. A thermal gasket and/or a thermal grease interposed between the heat conductive covering and the heat generating component may aid conduction.

A thermally conductive portion of the printed circuit board assembly may also include a thermally conductive internal layer within the surface of the printed circuit board. One or more thermally conductive regions on a perimeter of the printed circuit board assembly are in thermal communication with the thermally conductive portion between the heat-producing electronic component of the printed circuit board assembly and the heat transfer band. Further, thermally conductive interior regions of the printed circuit board assembly may also be in thermal communication with the thermally conductive portion between the heat-producing electronic component of the printed circuit board assembly and the heat transfer band.

A plurality of thermally conductive regions and/or heat generating components may be located on opposing sides of the printed circuit board assembly.

BRIEF DESCRIPTION OF THE DRAWING(S)

These and other features, benefits and advantages of the present disclosure will be made apparent with reference to the following detailed description, including the appended claims, and the accompanying figures, wherein like reference numerals refer to like structures across the several views, and wherein FIG. 1 illustrates a front view of the instrument enclosure of an exemplary embodiment of the present disclosure;

FIG. 3b illustrates in greater detail the portion of the PCB system mounting hardware circumscribed by 3B in FIG. 3a;

DETAILED DESCRIPTION OF EMBODIMENTS OF THE INVENTION

Figure 1:
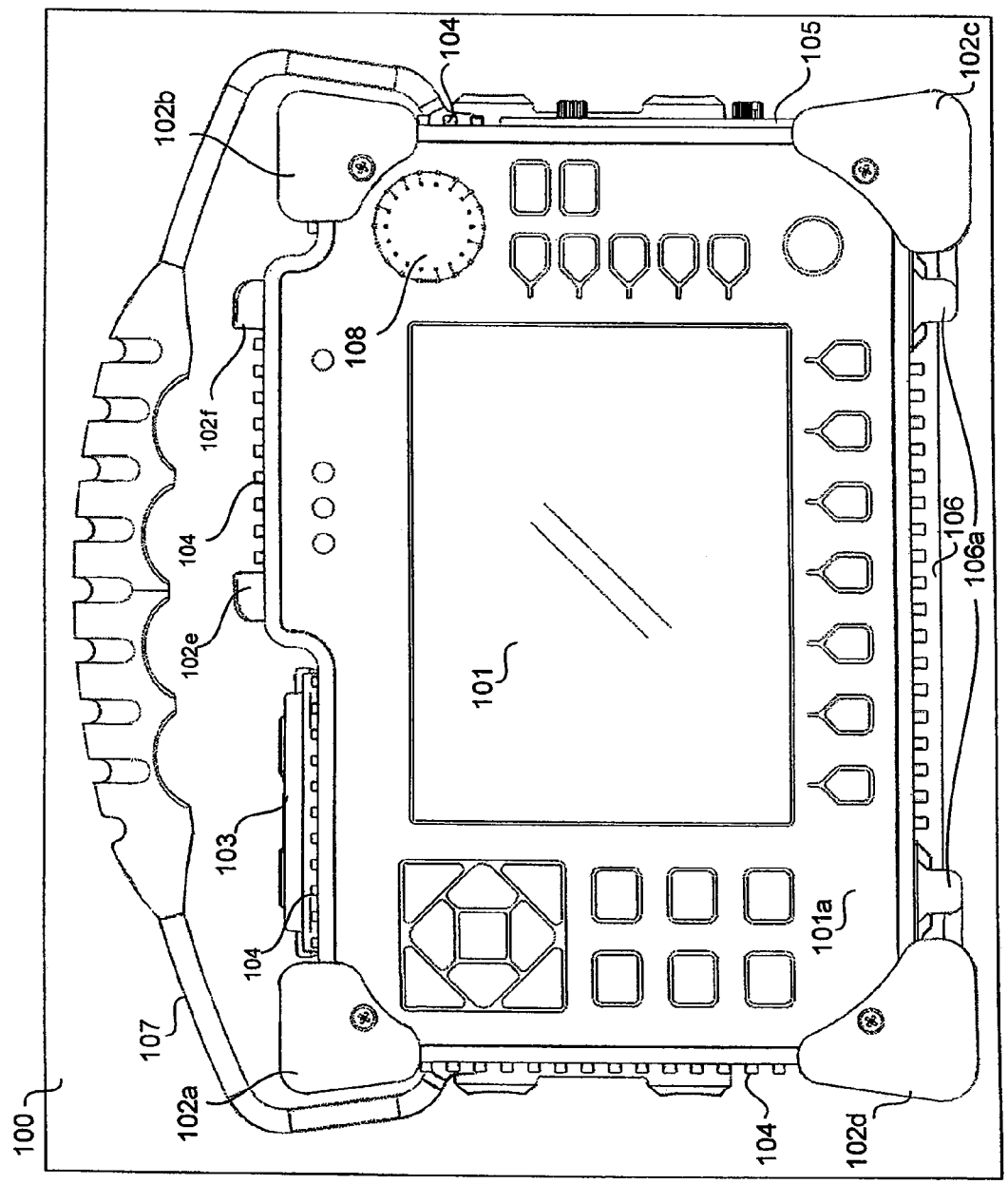

Certain electronic components, including NDI (Non-Destructive Inspection) devices, using e.g., ultrasonic, eddy currents, or the like, such as are contemplated for use with the enclosure herein disclosed, are used in a wide variety of harsh industrial environments and conditions. Environments associated with the inspection of pipelines, for example, range from arctic to desert conditions and all forms of whether in between. Nautical environments are also encountered where there is not only excessive moisture, but also salt water, which can be corrosive.

The instrument enclosure of the present disclosure ameliorates the unfavorable effects of said environments because it is optimized to perform without failure under a wide range of environmental and operating conditions. Furthermore, it is preferably small, compact, lightweight, rugged and otherwise ergonomic for ease of use and protection from accidental impact caused by, for example, dropping the unit.

The reliability of the instrument is improved because the internal electronic components are protected from moisture, dust, and other liquid or particle contaminants, all while maintaining an internal temperature that is lower than a maximum permissible operating temperature.

Specifically, the enclosure is preferably entirely sealed and includes a means to transfer the internally dissipated heat to the external environment, while maintaining robustness and ergonomics—i.e. small size, low weight, and well placed center of mass.

In addition, a variety and/or plurality of heat transfer bands can be used with a common set of enclosure parts. This provides the means to quickly respond to customer needs and economically produce application-specific instruments that use different heat transfer bands depending on the need for optimization. Examples of instrument characteristics that can be optimized by this method are heat transfer, weight, size, cleaning method and the number of circuit boards used.

More specifically, heat transfer can be optimized by increasing the external and/or internal surface area of the heat transfer band, such as by the means of heat transfer fins. Heat transfer may also be optimized by material selection and processing. Weight can be reduced by minimizing the volume and/or changing the type of material used for the heat transfer band. Enclosure size can be reduced by making the heat transfer band narrower, as could be the case when using one, instead of two parallel, PCB assemblies; or using PCB assemblies with lower height profiles. Size can also be reduced by minimizing or removing the external heat transfer fins, within the constrains of the power to be dissipated. Finally, enclosure size can be increased to adapt to a plurality of PCB's that need to have their heat transferred by means of the heat transfer band described herein. This can be done by coupling individual heat transfer bands together with other enclosure parts. To accommodate more than two PCB assemblies per heat transfer band, PCB mounting ledges at different elevations may by used (see, FIG. 6).

Furthermore, a system of external bumpers is used to mitigate the affects of shock and vibration that are typically associated with accidental dropping and transportation over long distances, respectively. The primary concerns associated with dropping, or otherwise shocking a unit, include induced PCB board flexure, which applies strain to the soldered connections between component mounting pins, or balls, and PCB pads. Very fine traces and internal PCB connections, such as vias, will also be strained. When the strain is excessive, the connections are damaged and become unreliable. A shock impulse can cause larger mass components, such as inductors and batteries, to become dislodged or otherwise compromised. Typically, shock resistance of electronic assemblies is achieved by use of strong impact resistant enclosure materials and a non-rigid mounting method for PCB assemblies—using rubber mounting grommets, for example. In some cases, shock absorbing materials, such as rubber, are applied to the exterior of the enclosure.

The strong impact resistant material prevents the enclosure from cracking, and in some cases absorbs shock when the material has the ability to deflect without causing damage. The non-rigid mounting method for PCB assemblies prevents torsional forces caused by enclosure deformation during impact from being substantially transferred to the PCB board, thereby minimizing flexure and the attendant problems described previously.

The preferred embodiment of the present disclosure combines a metallic heat transfer band with light weight and durable plastic front, rear, and other enclosure parts. The thermal management system of the preferred embodiment is therefore at odds with the conventional shock resistant design described above in the following ways. PCB assemblies must be rigidly mounted to the heat transfer band to maximize the conduction of heat that must flow to the exterior of the enclosure in an efficient a manner. Furthermore, rubber bumpers used on the exterior of the enclosure must be kept to a minimal size in order to maximize the exposed surface area of the heat transfer band for optimal heat convection with the surrounding air. The system of external bumpers of the preferred embodiment addresses this problem by being located on the instrument corner and outwardly protruding surfaces. These surfaces providing the only surfaces that come into contact with the planar surface that the instrument is dropped on, or otherwise applied to. As a result, the exposed external surface of the heat transfer band is maximized (for optimal heat convection), and the torsional and impulse force on the heat transfer band and the rigidly mounted PCB assemblies is minimized (for shock protection).

In combination with the system of external bumpers, the enclosure has its external connectors, knobs, fasteners, and other appendages positioned in such a way as to prevent them from taking a direct hit when the instrument is dropped on a planer surface. In some cases, this is true even when the connector of the mating cable assembly is connected.

An alternate embodiment of the present disclosure is contemplated that does not include a display, keypad or battery, but rather is just a sealed enclosure with the heat transfer band sandwiched between a front and rear enclosure section in a similar fashion as the preferred embodiment. The mounting of a plurality of heat transfer bands and the use of different heat transfer bands as described for the preferred embodiment is also contemplated for this alternate embodiment.

Referring now to FIG. 1, illustrated is a front view of the instrument enclosure, generally 100, of a first embodiment of the present disclosure. Visible from the front of the enclosure 100 are an LCD window 101. The enclosure includes shock resisting bumpers 102a through 102f, positioned to guard each of the eight corners of the enclosure 100, which in this embodiment is generally in the shape of a rectangular parallelepiped, in a manner that will be described further, below. An exterior of the enclosure 100 includes plate mounted transducer connectors 103, which in the exemplary embodiment may interface with a transducer of a Non-Destructive Inspection probe (not shown). A heat transfer band 104 extends around at least one, and preferably four, lateral sides of the enclosure 100. The enclosure 100 further includes an I/O port access door 105 permitting access to wired communication ports in the enclosure 100. A bottom adjustable support stand 106 in connected to the enclosure 100 on pivot mounts 106a. The enclosure also may include a rubberized carrying handle 107.

Figure 2:
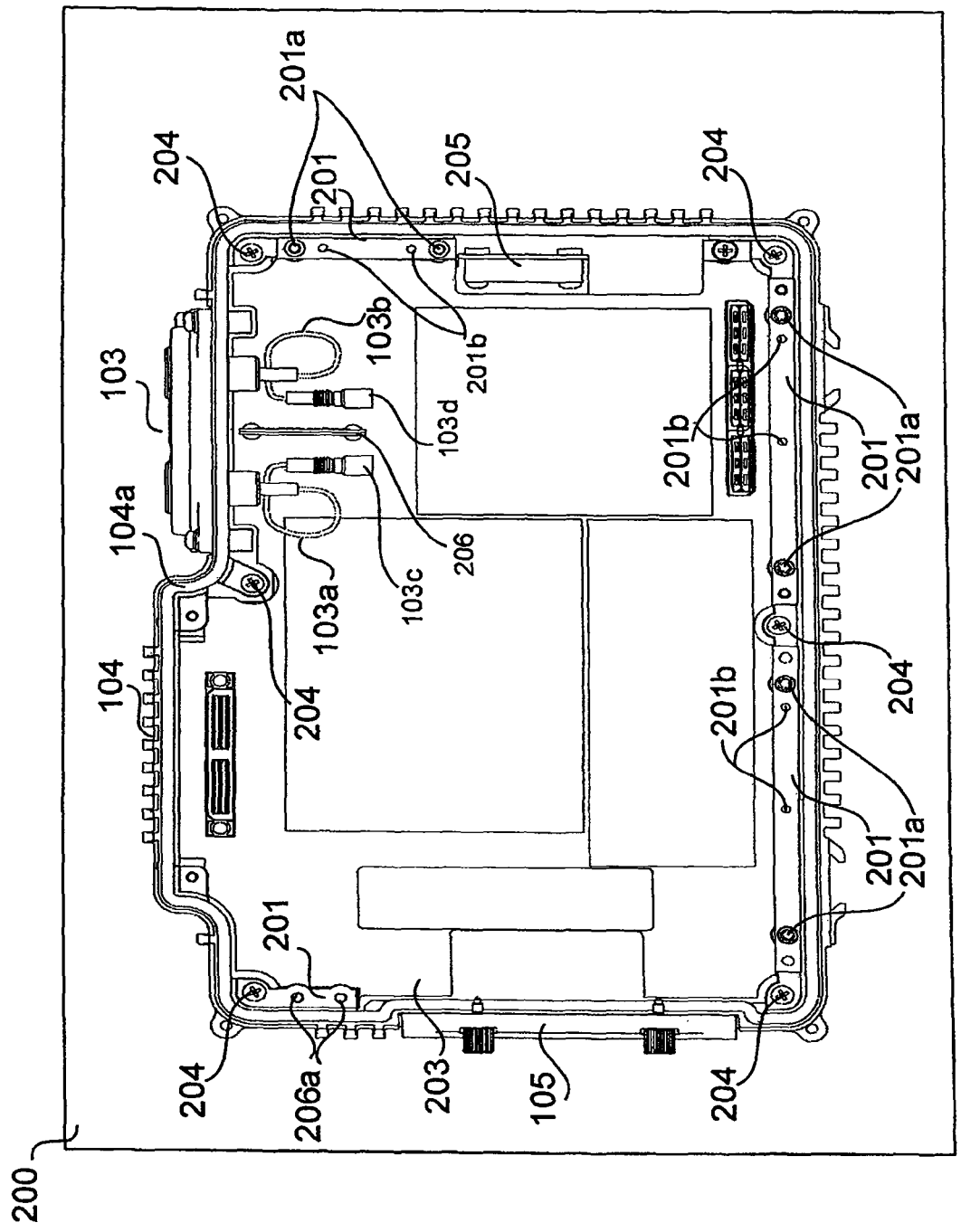
FIG. 2 illustrates an enclosure interior rear view of the heat transfer band assembly of the exemplary embodiment.

Referring now to FIG. 2, illustrated is an enclosure interior rear view of the heat transfer band assembly, generally 200, according to this exemplary embodiment of the present disclosure. The heat transfer band assembly 200 as viewed form the rear includes plate mounted transducer connectors 103 (also visible in FIG. 1), and also shows plate mounted connector transducer cable assemblies 103a and 103b, and PCB (printed circuit board) mating connectors 103c and 103d for transducer cable assemblies 103a and 103b, respectively. Heat transfer band 104 includes a perimeter ridge 104a. I/O access door 105 (also visible in FIG. 1) can also be seen. Compression blocks 201 include compression block fasteners and mating holes 201a, and compression block tapped holes 201b.

Also visible in the interior rear view of FIG. 2 is the rear PCB assembly 203. Heat transfer band 104 is mounted to the rear PCB assembly 203 by one or more heat transfer band mounting screws 204. A fan 205 circulates coolant, typically as in this case air, throughout the interior of the enclosure 100 including over the rear PCB assembly 203.

Figure 3:
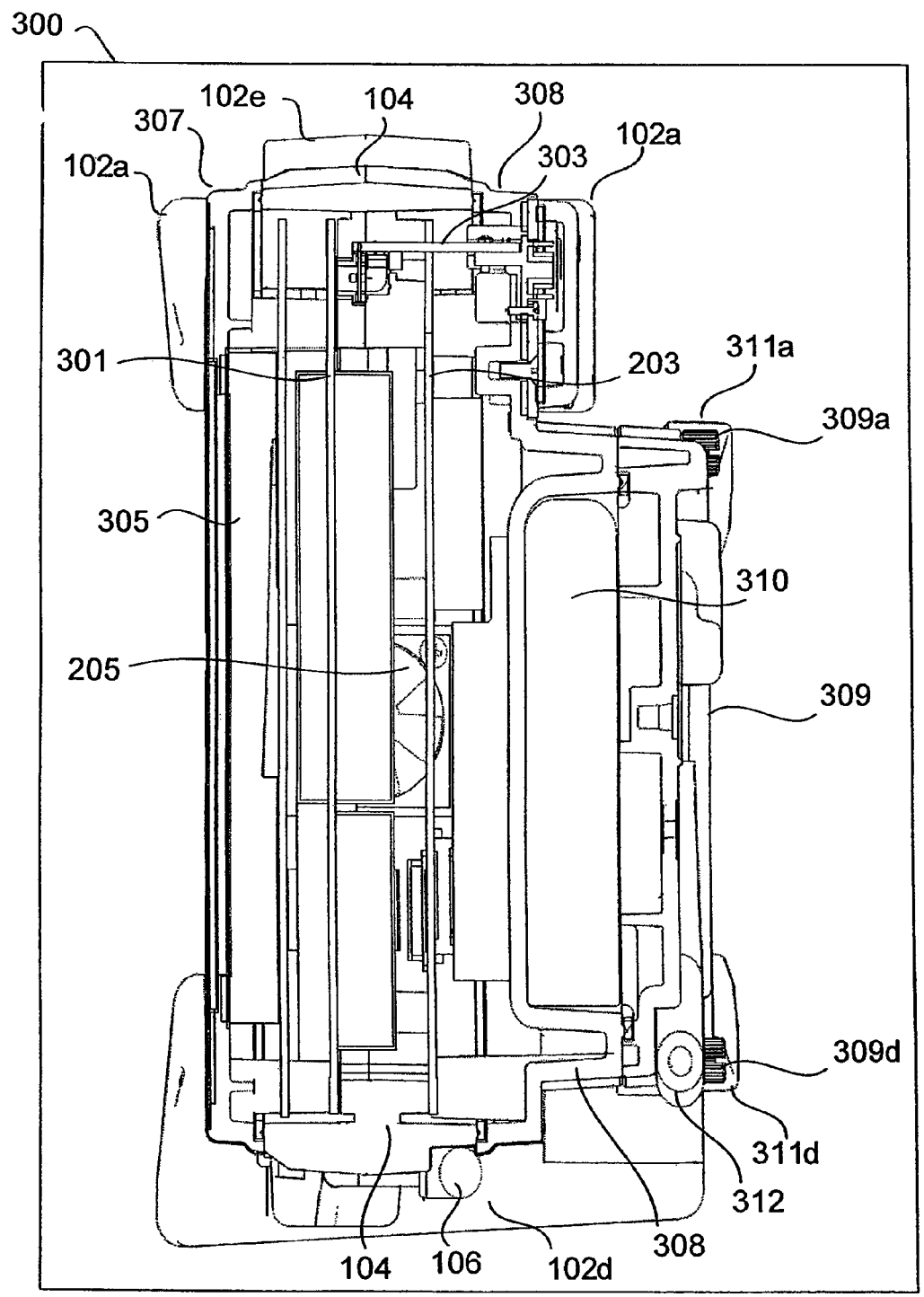
FIG. 3 illustrates a detailed right side cross-sectional view of the enclosure assembly of the exemplary embodiment.

FIG. 3 illustrates a detailed right side view of enclosure 100 according to the present embodiment. FIG. 3 shows the shock resisting corner bumpers 102a, d and e. Heat transfer band 104 is visible near the top and bottom extremities of the enclosure 100. The bottom adjustable support stand 106 is shown (also visible in FIG. 1). The rear PCB assembly 203 of FIG. 2 is also visible, as is a portion of fan 205. A front PCB assembly 301 is shown, having a PA interface PCB assembly 303. LCD 305 faces a front enclosure 307 of the enclosure 100. A complementary rear enclosure 308, together with front enclosure 307, border either side of the heat transfer band 104. A battery door 309 on the rear enclosure permits access to the battery 310. Battery door 309 is secured by battery door fastener screws 309a through d. The battery door also has its own shock resisting battery door bumpers 311a through d.

Figure 4:
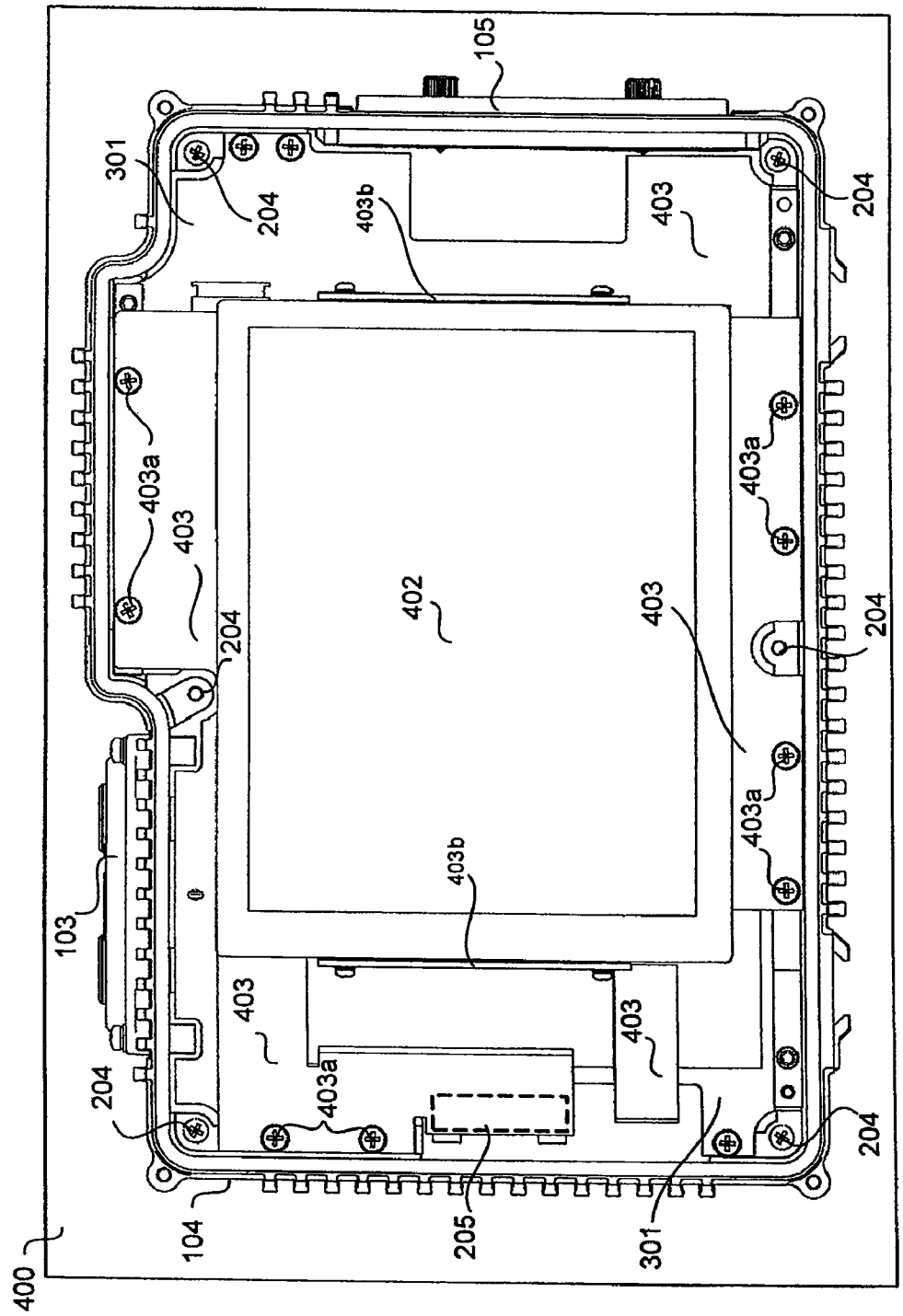
FIG. 4 illustrates an enclosure interior front view of the heat transfer band and LCD mounting plate assembly of the exemplary embodiment.

Referring now to FIG. 4, illustrated is an enclosure interior front view of the heat transfer band and LCD mounting plate assembly of the present embodiment. Heat transfer band assembly 400 includes heat transfer band 104. Fan 205 circulates coolant, typically as in this case air, over the PBC assemblies within the enclosure 100. A front PCB assembly 301 includes LCD 305, which is carried on LCD mounting plate 403. The LCD mounting plate 403 is secured by LCD mounting plate fasteners 403a.

Figure 5:
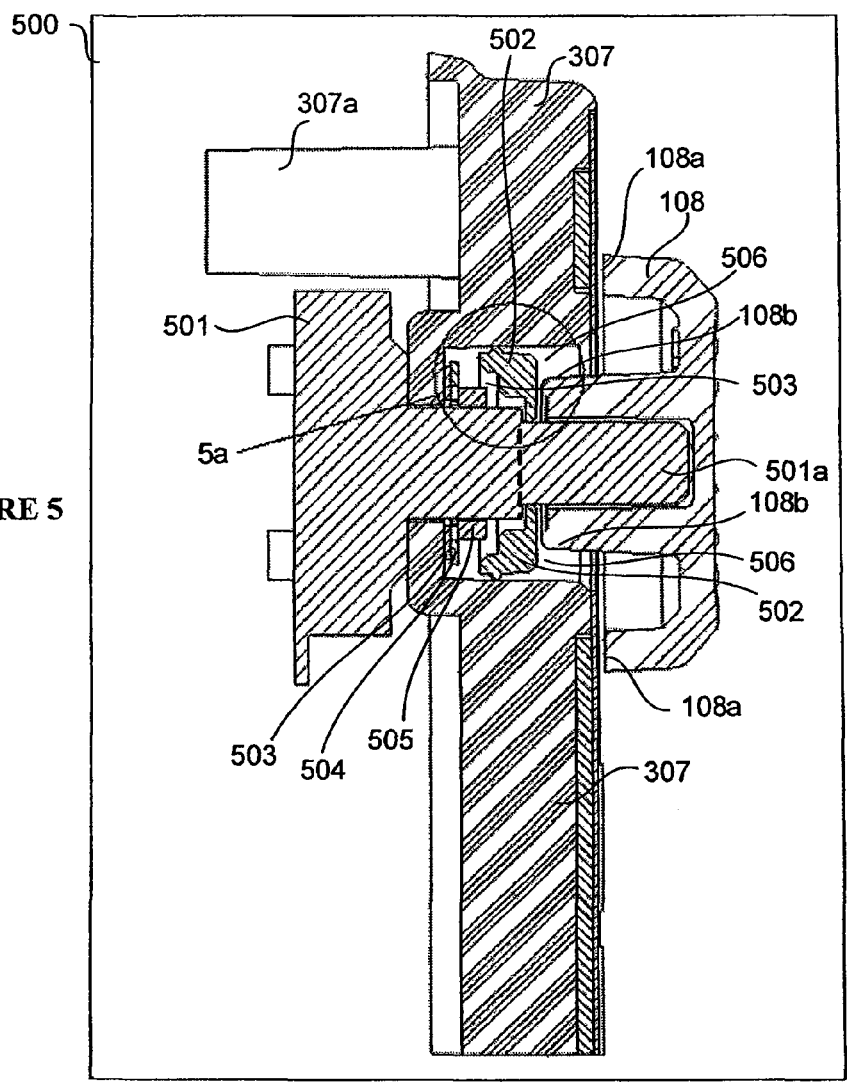
FIG. 5 illustrates an encoder shaft sealing system of the exemplary embodiment.
Figure 5A:
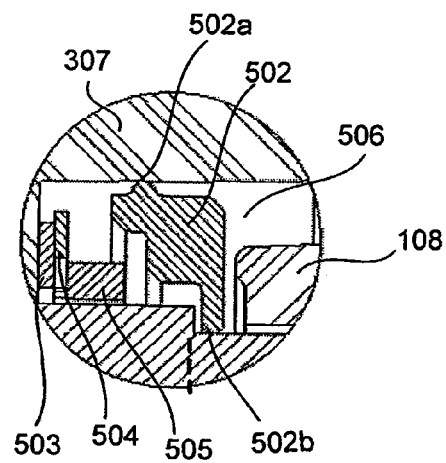
FIG. 5a illustrates in greater detail the portion of the an encoder shaft sealing system circumscribed by 5A in FIG. 5.

Referring now to FIG. 5, illustrated is an encoder shaft sealing system, generally 500, according to the present embodiment. It should be noted that the inclusion of encoder 501 or its associated sealing system 500 is not required for all embodiments of the instrument of the present disclosure.

Shaft 501a of encoder 501 is surrounded by edge 502b of continuous gasket 502. Exterior edge 502a of gasket 502 abuts the wall surface of front enclosure 307. Preferably, edge 502a is held under compression by the mating wall surface of front enclosure 307. O-ring grease (not shown) is optionally applied to any abutting surfaces to substantially eliminate air gaps in the sealing regions.

According to the present embodiment the sealed surfaces are comprised of the following abutment relationships: shaft 501a to continuous gasket 502 to wall surface of front enclosure 307. Accordingly, the encoder shaft sealing method prevents moisture and particles from entering the interior region of enclosure 100.

Furthermore, the geometry of encoder knob 108 and its relationship to the surfaces of front enclosure 307 is optimized to diffuse liquids sprayed under high pressure before they enter region 506 where continuous gasket 502 is located. Said diffusion minimizes the force and amount of liquid entering region 506. Surface 108a of encoder knob 108 is located only a short distance away from the front surface of front enclosure 307, and surface 108b is located only a short distance away from the wall surface of front enclosure 307 that encircles it. Said distances are as short as can be achieved within the combined tolerances of the said parts and assembly method.

The amount of sprayed water entering region 506 is restricted by said distances; therefore, it is advantageous for these distances to be as short as possible without interfering with any other aspects of functionality, such as restricting the ease of rotation of encoder shaft 501a.

Figure 6:
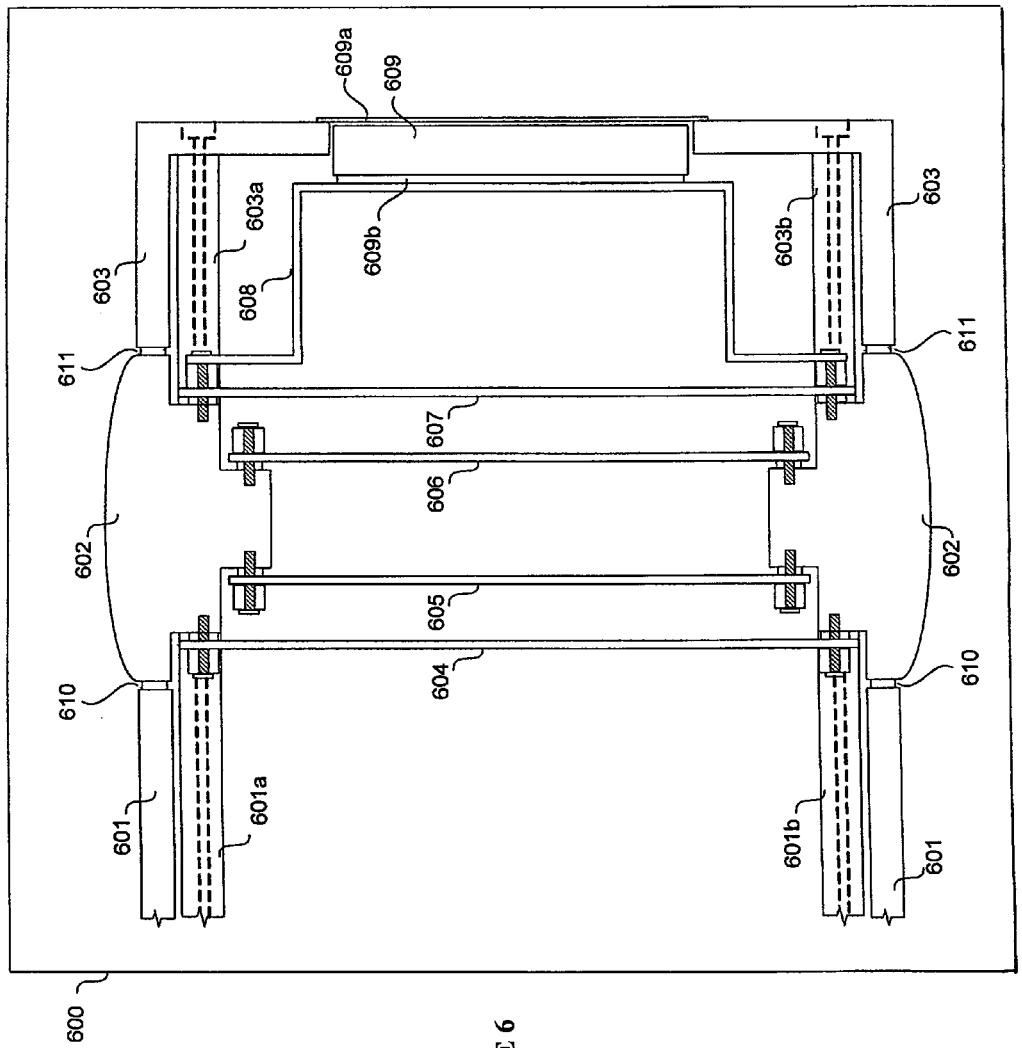
FIG. 6 illustrates an alternate embodiment of the heat transfer band with a plurality of mounted PCB assemblies.

Referring now to FIG. 6, illustrated is an alternate embodiment of the heat transfer band with a plurality of mounted PCB assemblies. A heat transfer band assembly, generally 600 is comprised of heat transfer band 602. Plural PCB assemblies are mounted to the heat transfer band 602, and include an outer rear PCB assembly 604, an inner rear PCB assembly 605, and inner front PCB assembly 606, and an outer front PCB assembly 607. Similar to the prior embodiment, also included is an LCD 609, which is viewable through an LCD window 609a in the front enclosure 603. An LCD thermal gasket 609b facilitates heat flow from the LCD 609 to the heat transfer band 602 through the LCD mounting flange 608.

The front enclosure 603 is secured to the heat transfer band 602 via mounting bosses 603a, 603b. Similarly, rear enclosure 601 is secured to the heat transfer band 602 via mounting bosses 601a, 601b. Gaskets 610 and 611 seal the rear enclosure 601 and the front enclosure 603, respectively, against the heat transfer band 602 at its respective lateral edges. Like the heat transfer band 602, and particularly its front and rear edges, the gaskets 610, 611 are continuous to effectively seal the enclosure 600 against ingress of water or contaminants at the interface of the heat transfer band 602 with front enclosure 603 and rear enclosure 601. Either or both of the gaskets 610, 611 may be a thermally conductive gasket to aid thermal dissipation by facilitating heat flow to the heat transfer band 602.

The embodiment of FIG. 6 may be further modified to include fewer or more PCB assemblies, including an odd number of PCB assemblies.

Figure 7:
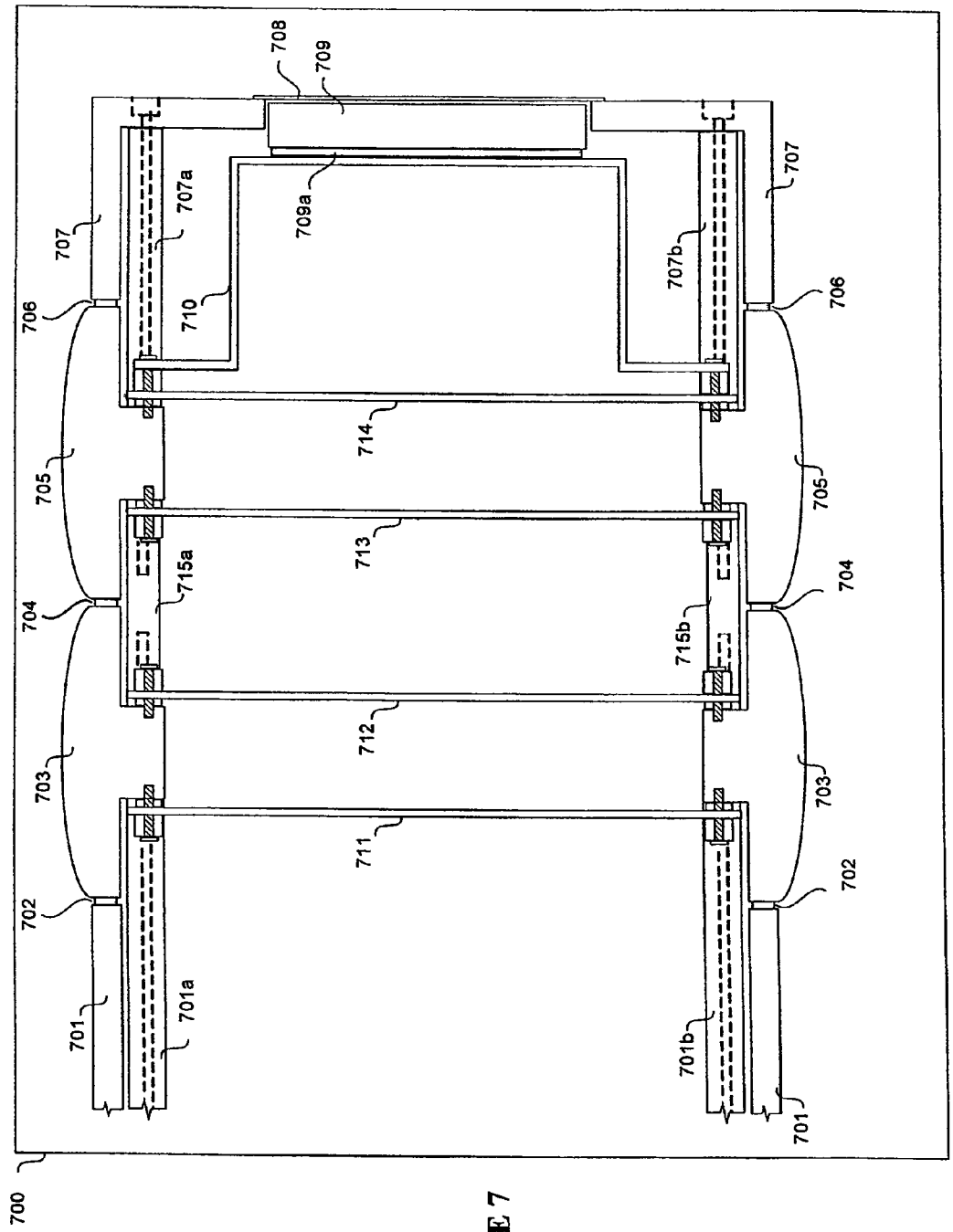
FIG. 7 illustrates an alternate embodiment using a plurality of heat transfer bands.

Referring now to FIG. 7, illustrated a further alternate embodiment using a plurality of heat transfer bands. Heat transfer band assembly, generally 700, according to this embodiment is comprised of plural heat transfer bands 703, 705. Plural PCB assemblies are mounted to the heat transfer bands 703, 705, and include and outer rear PCB assembly 711, and inner rear PCB assembly 712, and inner front PCB assembly 713, and an outer front PCB assembly 714. Additionally, LCD 709 is displayed through and LCD window 708 in the front enclosure 707. An LCD thermal gasket 709b facilitates heat flow from the LCD 709 to the heat transfer band 705 through the LCD mounting flange 710.

The front enclosure 707 is secured to the heat transfer band 705 via mounting bosses 707a, 707b. Similarly, rear enclosure 701 is secured to the heat transfer band 703 via mounting bosses 701a, 701b. Gaskets 702, 704, and 706 seal the rear enclosure 701 against heat transfer band 703, heat transfer band 703 against heat transfer band 705, and the front enclosure 707 against heat transfer band 705, respectively. at the respective lateral edges of front and rear enclosures 701, 707 and heat transfer bands 703, 705. Like the heat transfer bands 703, 705, and particularly their respective lateral edges, the gaskets 702, 704 and 706 are continuous to effectively seal the enclosure 700 against ingress of water or contaminants at the interface of the heat transfer bands 703, 705 with front enclosure 707 and rear enclosure 701. One or more of the gaskets 702, 704 and 706, in particular gasket 704 between heat transfer bands 703 and 705, may be a thermally conductive gasket, which would facilitate distribution of any thermal imbalance between the heat transfer bands 703, 705, and aid thermal dissipation by taking advantage of the combined external surface area of the heat transfer bands 703, 705.

Figure 7A:
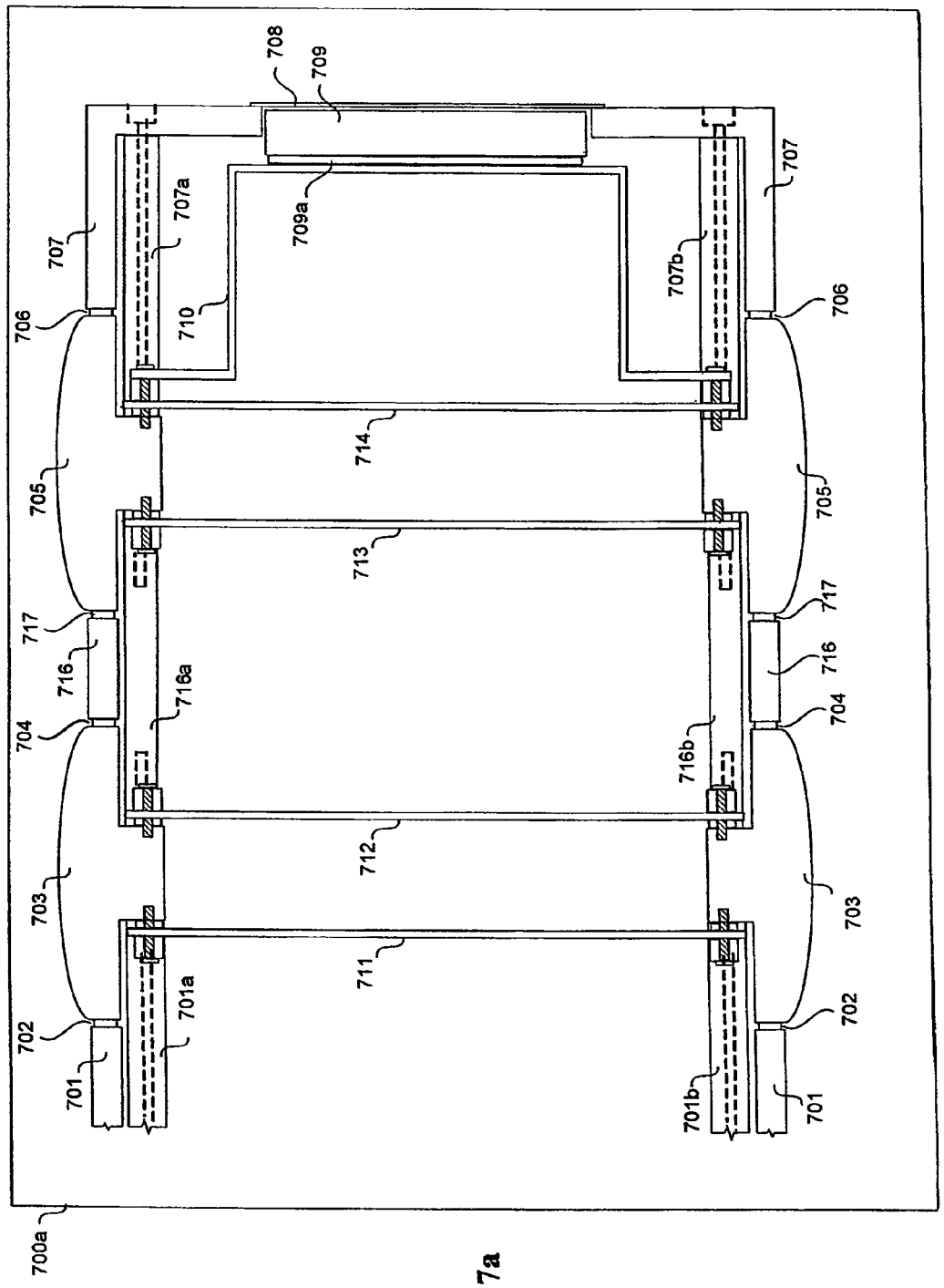
FIG. 7a illustrates an further alternate embodiment using a plurality of heat transfer bands.

Referring now to FIG. 7a, illustrated is a further alternate embodiment using a plurality of heat transfer bands. As depicted in FIG. 7a, enclosure wall segment 716 with associated mounting bosses 716a, 716b, may be used to couple heat transfer bands 703 and 705 together by means of fasteners as described earlier. A gasket 717 and enclosure section 716 are interposed between gasket 704 and heat transfer band 705.

It should be noted that the structure and methods of these embodiments are not limited to two heat transfer bands. Accordingly, a plurality of heat transfer bands may be used. Moreover, with reference to FIGS. 3a, 7, any heat transfer band 104, 602, or 702 & 705, respectively, may be assembled to the same mating parts. Specifically, either front enclosure sections (e.g., 307) or rear enclosure section (e.g., 308) and their associated gaskets and fastener hardware. Accordingly, the electronic system utilizing the enclosure of the present disclosure may be made modular, so that certain PCB assemblies, or combinations thereof, may be prefabricated to respective heat transfer rings (e.g., 104), and these may be substituted and/or stacked.

Similarly, the mating enclosure parts (e.g., front enclosure 307 or rear enclosure 308) may be those of the preferred embodiment of the present disclosure, or may be substituted with other parts, such as those used to simply house the internal electronics and provide interconnect wiring, and/or mounting provisions, but without some or all of an integral graphical user interface (e.g., LCD 305), keypad (shown integrated with front surface 101a; FIG. 1), or encoder knob 108.

Figure 8:
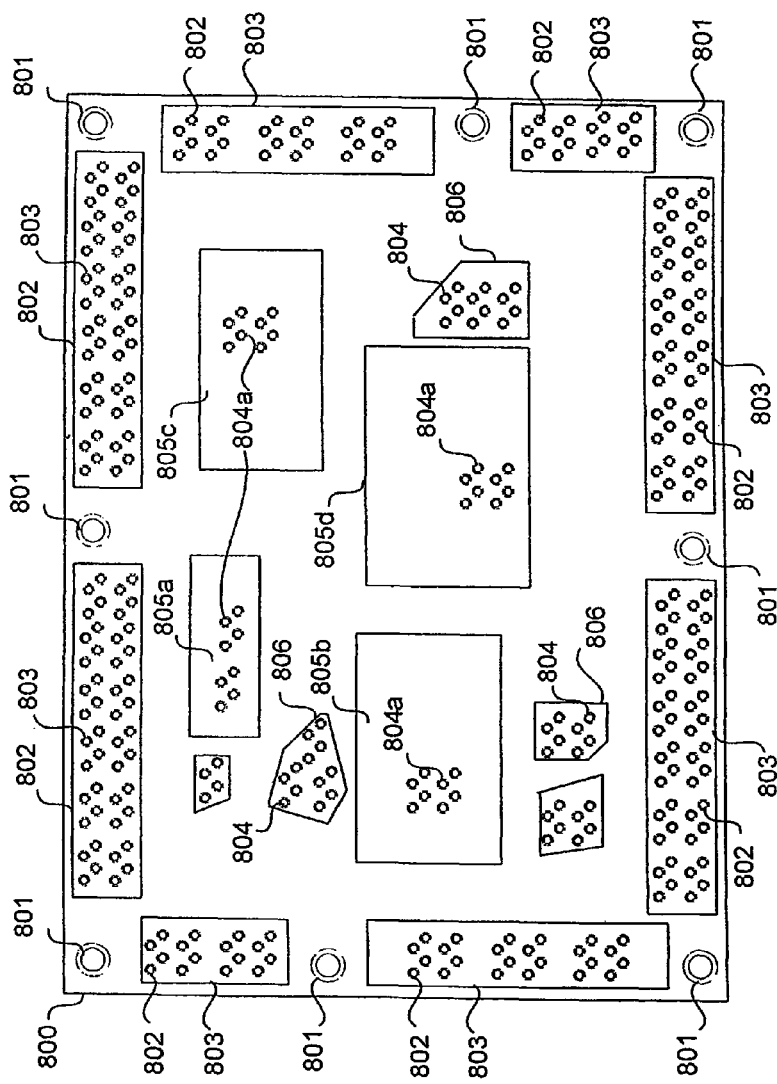
FIG. 8 illustrates an exemplary PCB assembly heat transfer system.
Figure 8A:
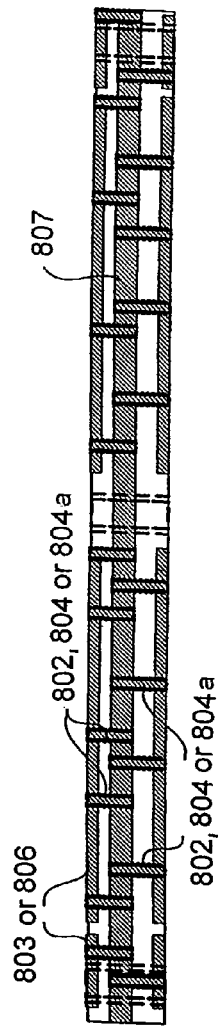
FIG. 8a illustrates a cross sectional view of exemplary PCB assembly heat transfer system.

Referring now to FIG. 8, illustrated is an exemplary PCB assembly heat transfer system, generally 800, according to the present disclosure. The PCB assembly heat transfer system 800 is comprised of mounting holes 801, useful for securing the PCB assembly heat transfer system 800 to a heat transfer ring, e.g. 104 as described, above. Perimeter heat conduction vias 802 conduct heat from associated perimeter heat conduction regions 803. Interior heat conduction vias 804 conduct heat from associated interior heat conduction regions 806. Heat conduction vias 804a are located beneath associated electronic components 805a through 805d. Heat conduction vias 803, 804, and 804a each connect their respecting heat conduction regions with a thermally conductive internal layer 807 generally throughout the PCB assembly heat transfer system 800. FIG. 8a illustrates a vertical cross-section of the PCB assembly heat transfer system 800, including the respective locations of perimeter heat conduction regions 803, interior heat conduction regions 806, vias 802, 804, and thermally conductive internal layer 807. Cross-sectional view of FIG. 8a shows vias 802, 804 extending from both surfaces of the PCB assembly heat transfer system 800, with surface heat conduction regions on both sides thereof. The PCB assembly heat transfer system 800 may be populated with electronic components, e.g., 805a through 805d, on both sides, or may have such components on only one side thereof.

Figure 10:
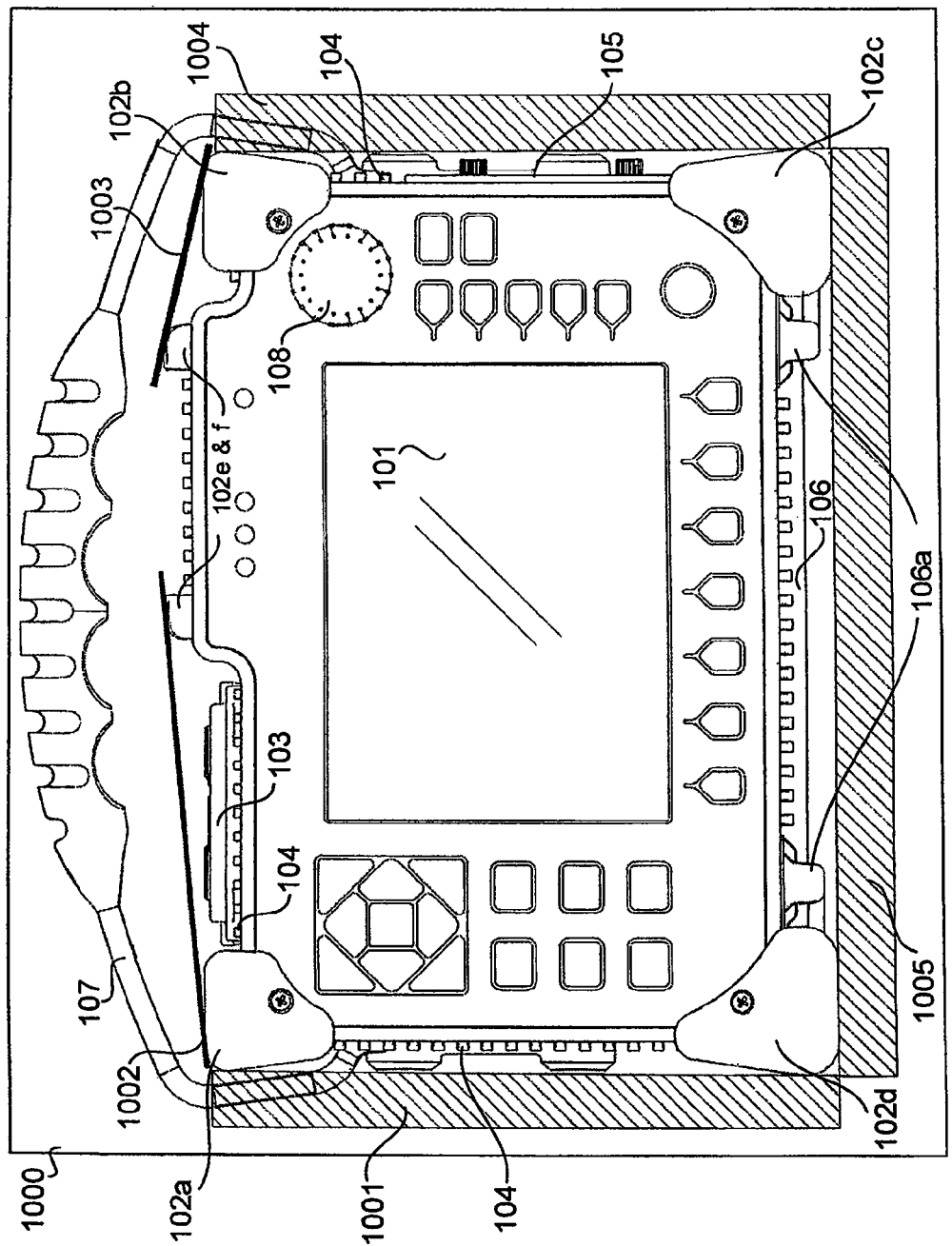
FIG. 10 illustrates an enclosure front view with planar impact surfaces.

Referring now to FIG. 10, illustrated is an enclosure front view with planar impact surfaces. In particular, illustrated is the manner in which shock resisting bumpers 102a through 102f absorb any planar impact spanning any two adjacent bumpers. Left side bumpers 102a and 102d come into contact with planar surface 1001 thereby preventing the left side of heat transfer band 104 from doing so. The same holds true respectively for right side bumpers 102b and 102c with respect to planar surface 1004 and the right side of heat transfer band 104; bottom bumpers 102d and 102c with respect to planar surface 1005 and the bottom side of heat transfer band 104; top bumpers 102a and 102e with respect to planar surface 1002 and plate mounted transducer connectors 103; top bumpers 102e and 102f with respect to a parallel planar surface (not shown) above it and the top right side of heat transfer band 104; and top bumpers 102f and 102b with respect to planar surface 1003 and the top right-most side of heat transfer band 104. These planar surfaces ignore the possible interference of rubberized carrying handle 107, which itself may absorb some or all of an impact before the planar impact surface reaches one or more of shock resisting bumpers 102a through 102f.

Figure 11:
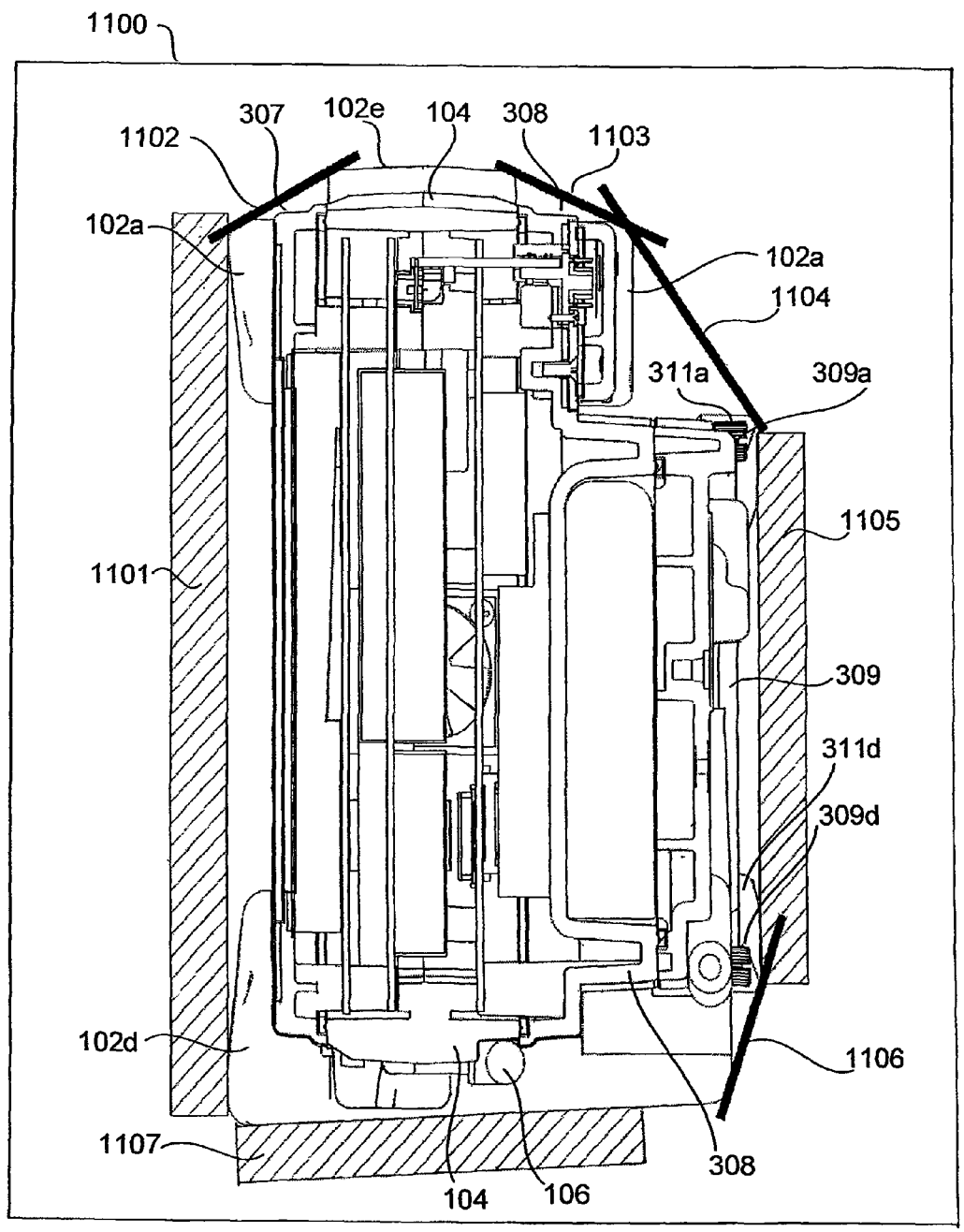
FIG. 11 illustrates an enclosure side view with planar impact surfaces.

Referring now to FIG. 11, illustrated is an enclosure side view with planar impact surfaces. As illustrated in FIG. 11, bumpers 102a and 102d, or 102b and 102c (not shown) come into contact with planar surface 1101 thereby preventing the front surface of the enclosure from doing so. The same holds true respectively for bumpers 102a, 102b, 102e, and 102f (102e and 102f not shown in FIG. 11) with respect to planar surface 1102 and an upper portion of front enclosure 307 and heat transfer band 104; bumpers 102a, 102b, 102e, and 102f (102e and 102f not shown in FIG. 11) with respect to planar surface 1103 and an upper portion of rear enclosure 308 and heat transfer band 104; bumpers 102a, and 102b, and battery door bumpers 311a, 311b, 311c and 311d (311b and 311c not shown in FIG. 11) with respect to planar surface 1104 and the upper portion of rear enclosure 308, including connectors 901a, 901b and 901c, which may alternatively any protruding object attached to the enclosure; and battery door bumpers 311a, 311b, 311c and 311d (102b, 311b and 311c not shown in FIG. 11) with respect to planar surface 1105 and battery door 309.

Figure 12:
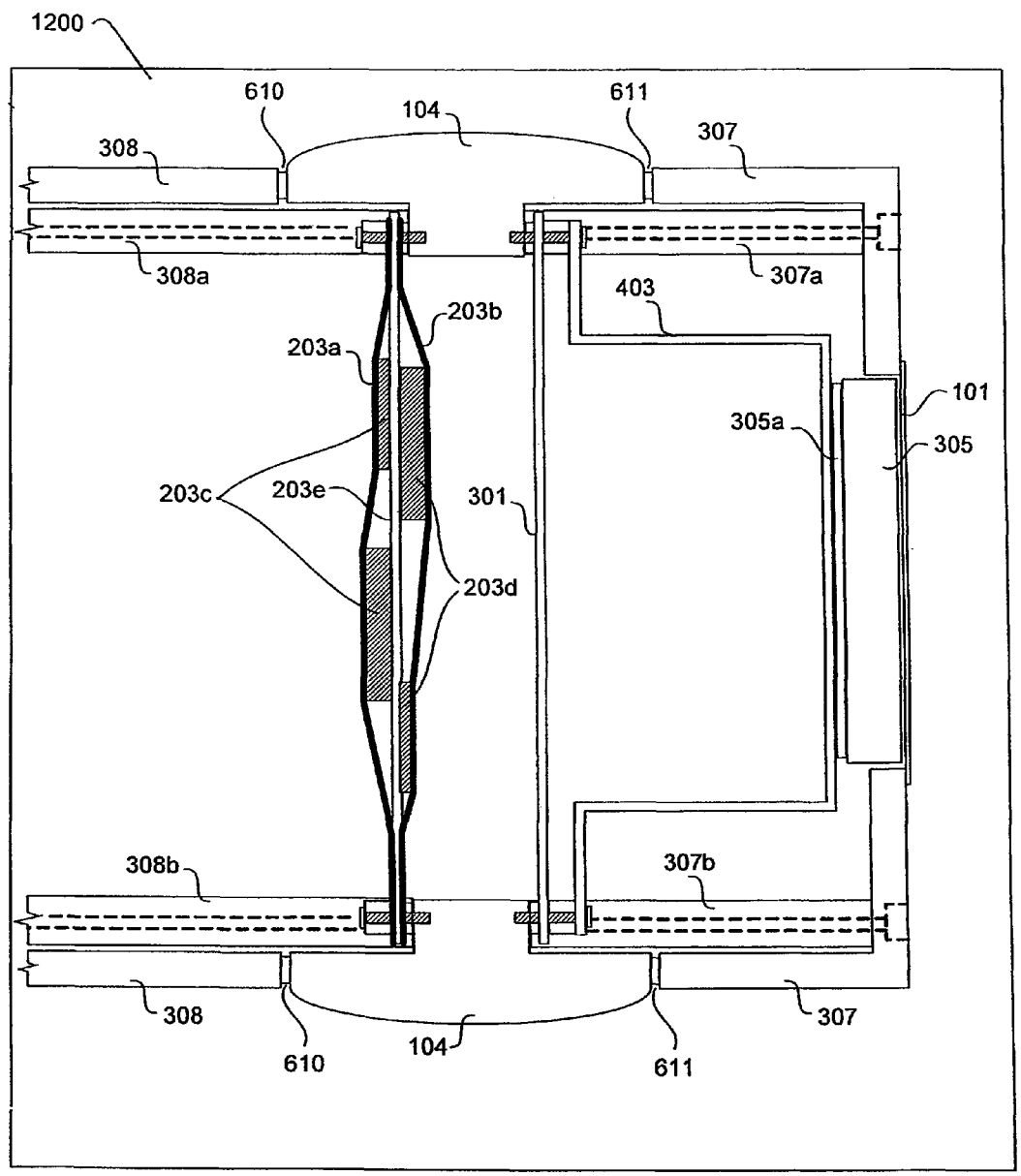
FIG. 12 illustrates a simplified left side view of enclosure assembly of alternate embodiment with exemplary PCB heat transfer covering.

Referring now to FIG. 12, illustrated is a simplified left side view of enclosure assembly of alternate embodiment with exemplary PCB heat transfer covering. In this embodiment PCB assembly 203e has heat conducting elements 203a and b that are coupled to heat transfer band 104 in at least one, but preferably two locations.

Exemplary heat conduction elements 203a and b are composed of an efficient heat conducting material, such as aluminum or sheet metal, having a topographical profile suitable for compression contact with top surfaces of heat generating components 203c and 203d, and coupling to heat transfer band 104. Typically, a thermal gasket or grease (neither shown) is applied between the abutting surfaces of said heat conduction elements 203a, 203b, and heat generating components 203c, 203d, and heat transfer band 104 in order maximize heat conduction.

Heat conduction elements 203a and b may be fabricated by a number of methods, with machining, die casting, and stamping being the most prevalent. Furthermore, although not shown, said exemplary heat conduction elements 203a, 203b may be applied to any or all PCB assemblies that are coupled to a heat transfer band 104. When composed of a suitable material and geometry, heat conduction elements 203a and 203b also serve as shields for electromagnetic signals that the PCB assemblies may radiate, or that they be susceptible to from external sources.

The manner of operation of the foregoing components will now be described in further detail.

The present disclosure is concerned with designing an instrument that is rugged, small, light weight and otherwise ergonomic while being capable of performing without failure under a wide range of environmental and operating conditions. Instrument enclosure 100 is completely sealed to prevent moisture, liquid or dust from entering it.

The enclosure 100 of the present embodiment of the disclosure is intended to operate in environmental conditions that include a wide ambient temperature range, preferably at least from −10 to 50 deg Celsius. The present disclosure also provides a means to meet CE safety specification EN61010-1, which requires that any external enclosure surface that can be touched not exceed 70 degrees Celsius when in 40 degree Celsius external ambient air. The enclosure 100 must withstand very wet environments, such as use in heavy rain or on vessels at sea. The enclosure must tolerate very dusty and dirty environments. Finally, the enclosure must withstand areas where it is likely that the instrument will be accidentally dropped, or otherwise mechanically shocked.

An aspect of the preferred embodiment enclosure 100 is that it is usable for a high performance NDI device, with a nominal power consumption of 17 watts. The challenge is to dissipate this considerable power in completely sealed enclosure 100, i.e. one in which there is no exchange of internal and external air.

The heat transfer band 104 simultaneously serves as the principal means of heat transfer from the interior to exterior of the enclosure (e.g., FIGS. 2 and 9), a mount for PCB assembles (e.g., FIGS. 2, 3 and 3a), and a structural part of enclosure forming a continuous band that provides a portion of the interior and exterior walls of the enclosure, and a continuous perimeter wall edges for abutment to gaskets located between the coupled surfaces of mating parts, i.e. the front and rear plastic housing parts. (e.g., FIGS. 2, 3a and 9). The geometry of heat transfer band assembly 200 is optimized to minimize the volume it takes up in the enclosure, while still providing maximum PCB board space and ample heat transfer.

Figure 3A:
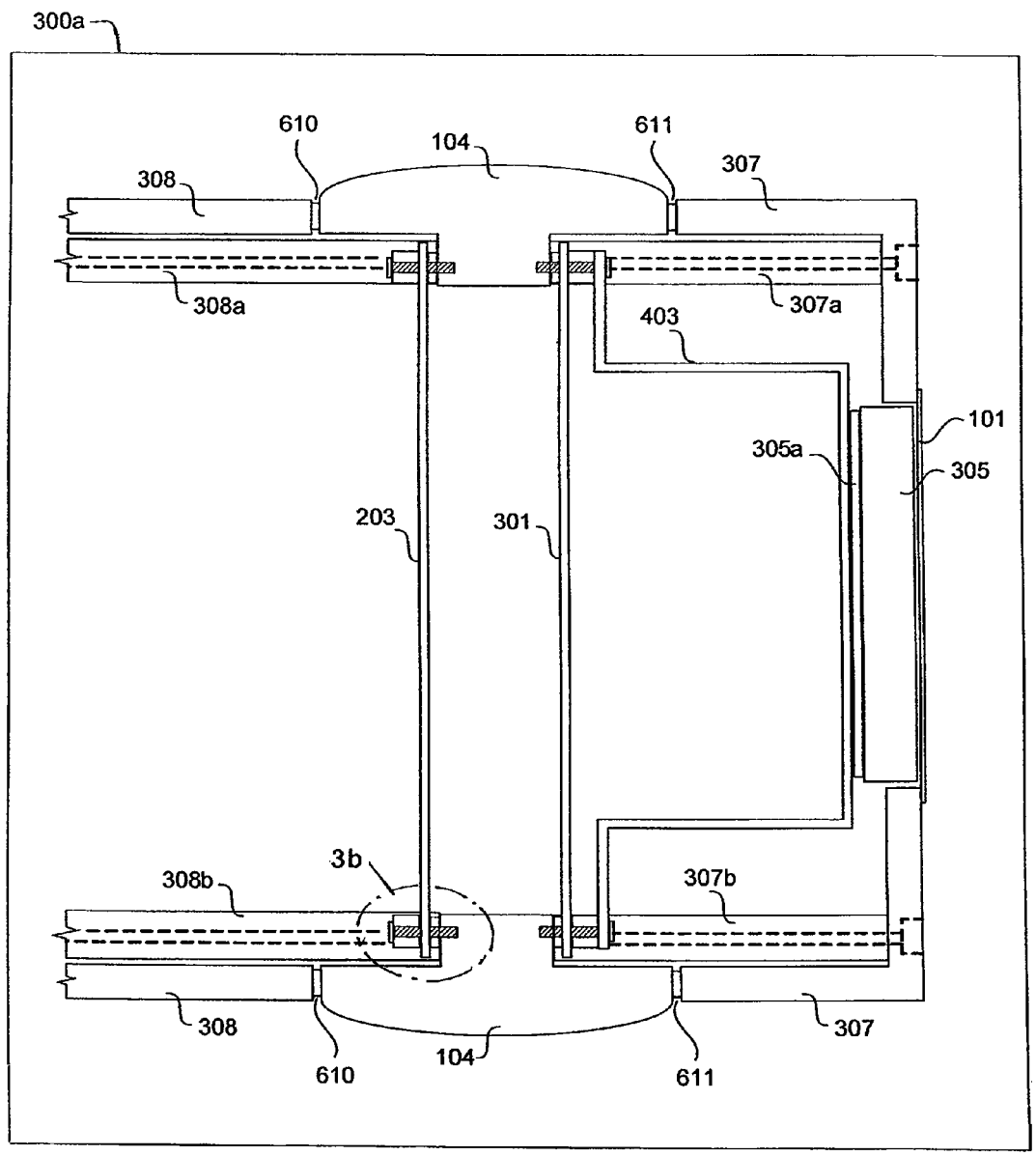
FIG. 3a illustrates a simplified left side view of enclosure assembly of the exemplary embodiment.

With reference to FIGS. 2, 3a, heat transfer band 104 encompasses the entire edge perimeter of the PCB's mounted within it (e.g., 203 and 301), the elevation of components mounted on said PCB's not exceeding the elevation of pre-established planar regions that run parallel to the PCB's top and bottom surfaces. Said regions, known as 'keep out areas', represent regions where no other parts of the enclosure may locate, typically to prevent mechanical interferences.

Enclosure Sealing System

Figure 9:
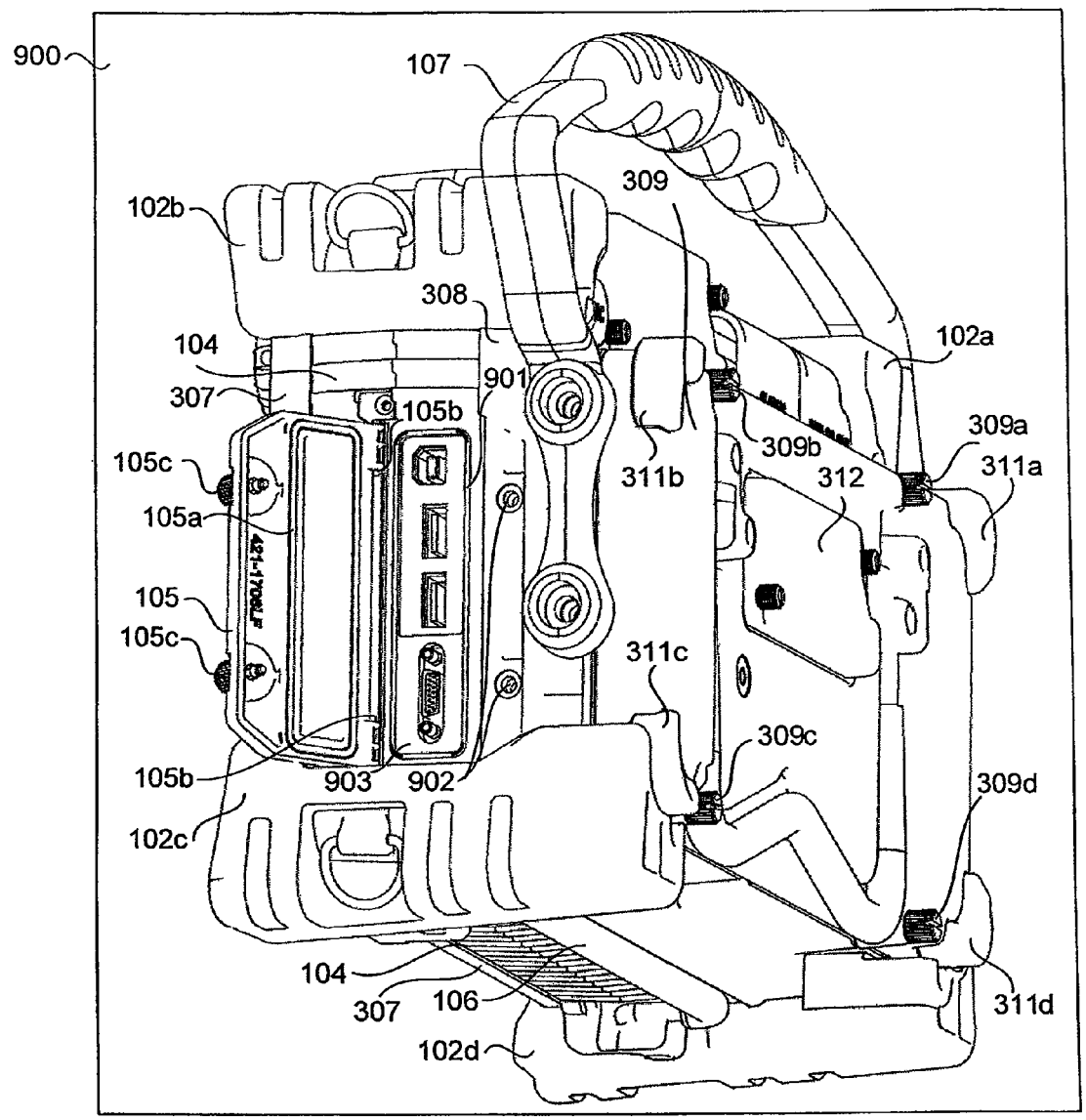
FIG. 9 illustrates an enclosure side view with IO access door.

With reference to FIGS. 1, 3a and 9, there are four primary sections that form the exterior and interior walls of enclosure 900, the edges of which are coupled together with continuous gaskets 610 and 611 (FIG. 3a) or adhesive in between. It should be noted that the gaskets must be kept under compression by abutting surfaces of rear enclosure 308, gasket 610, heat transfer band 104, gasket 611 and front enclosure 307 in order to provide desired sealing.

The abutment relationships forming the seals are: front enclosure 307 to continuous gasket 611 to heat transfer band 104; heat transfer band 104 to continuous gasket 610 to rear enclosure 308; and rear enclosure 308 to continuous gasket (not shown) to battery door 309.

The principal portions of enclosure 100 are fastened together by screws, the threaded portions of which are inserted through the mounting holes of front enclosure bosses 307a & b and rear enclosure bosses 308a & b, then into the holes provided for them in the respective sides of heat transfer band 104 (FIG. 3a). This fastening method provides a means to keep the gaskets in proper compression, thereby forming a continuous seal around the seams of said coupled parts.

Other sealed surfaces of the enclosure 100 are comprised of similar abutment relationships. Plate mounted transducer connectors 103 (FIG. 1) are sealed by a continuous gasket (not shown) to heat transfer band 104. Similarly, a plurality of panel mount or plate mounted connectors can be sealed likewise by continuous gasket to a mating surface of the enclosure. The LCD window 101 (FIG. 1) may be sealed by and adhesive to the front enclosure 307. Shaft 501a (FIG. 5) of encoder 501 in connection with encoder knob 108 is sealed by a continuous gasket 502 to the front enclosure 307.

Continuing with FIG. 9, IO access door 105 protects data connectors, in this embodiment four including USB and d-sub connectors, in region 903 from moisture and dust when closed and securely fastened by means of fasteners 105c inserted into holes 902. Gasket 901 is kept under proper compression when IO access door 105 is securely fastened by fasteners 105c.

Enclosure Heat Transfer System

With reference to FIG. 2, heat transfer band assembly 200 is comprised of heat generating PCB assemblies 203 and 301, each of which are coupled to heat transfer band 104 in the same manner. The following explanation of the coupling method applies to both PCB assemblies, but refers only to PCB assembly 203 because FIG. 2 is a plan view; therefore, PCB assembly 301 which is underneath PCB assembly 203 cannot be shown.

PCB assembly 203 is coupled to heat transfer band 104 by means compression blocks 201 with a heat conductive gasket placed between the overlapping portions of the PCB board and heat transfer band 104. Compression blocks 201 are secured to heat transfer band 104 by means of compression block fasteners and mating holes 201a.

Figure 3B:
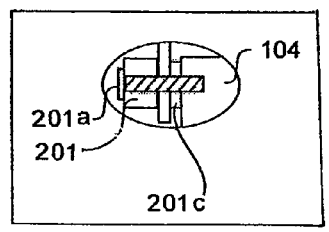

A section view of this fastening method into heat transfer band 104 is shown in the FIG. 3b, illustrating a typical assembly of compression block fasteners 201a, compression blocks 201 and thermal gaskets 201c, respectively.

The source of the heat inside of the main enclosure cavity is substantially generated by the electronic components 203c and 203d (FIG. 12) mounted on PCB assembly 203, and likewise similarly to PCB assembly 301 (not shown). In the exemplary embodiment of the present disclosure, these components consume approximately 13 watts of electrical power.

Additionally in the exemplary embodiment, the internal backlight and other components of LCD 305 consume approximately 4 watts. The heat generating components conduct their heat in the paths of least thermal impedance that are provided by the present invention.

For PCB assemblies 203 and 301 (and similarly for references 604, 605, 606, 607, 711, 712, 713, 714 of the alternate embodiments) mounted to heat transfer band 104, the component generated heat is coupled to heat transfer band 104 by the two methods described below.

PCB components to PCB (printed circuit board)—With reference to FIGS. 8 and 8a of an exemplary PCB construction, the PCB has at least one internal planer layer 807 of copper or other conductive material for electrical purposes, but also for the conduction of heat in lateral directions toward heat transfer band 104 coupling locations as shown in FIG. 2. Conductive vias 802, 804 and 804a and their associated regions 803, 806 and 805a through 805d, respectively, are provided for both electrical and thermal conduction from the PCB's outer surfaces to the internal PCB conductive plane.

As depicted in the exemplary PCB construction of FIGS. 8 and 8a, there are at least three basic types of conductive vias and regions, each of which are thermally and electrically connected. The descriptions below apply to either side of the PCB assembly.

Conductive vias 804a are located under substantial heat generating components 805a, 805b, 805c and 805d, and are connected to terminals of said components (typically the ground terminals). First, heat is transferred through vias 804a to conductive internal layer 807. Conductive vias 804 are located within interior heat conduction regions 806 which are positioned as close as possible to said heat generating components. Second, heat is transferred from said regions through said vias to conductive internal layer 807. Conductive vias 802 are located within perimeter heat conduction regions 803 which are positioned along the perimeter of the PCB. Third, heat is transferred to said regions from said vias emanating from conductive internal layer 807 which serves as a path of thermal conduction for the heat generated by said components mounted to the exterior surfaces of the PCB, as described above.

With reference to FIG. 3a, the heat from perimeter heat conduction regions 803 (FIGS. 8 and 8a) of PCB assemblies 203 and 301 is conducted to heat transfer band 104 by means of abutment relationships. The PCB perimeter heat conduction regions 803 abut thermally conductive gasket (e.g., 201c) in contact with heat transfer band 104.

It is important to note that there are practical limitations to achieving the aforementioned integral PCB heat transfer method due to signal routing, placement density, and other PCB layout constraints—especially for portable products that require a high degree of density for miniaturization. It should also be noted that the insulating PCB material (typically and in this case some form of fiberglass, though other materials e.g., silicon may be suitable) provides heat conduction as well. Accordingly, it should be noted that the method of using heat transfer through internal layer 807 need not be applied to achieve the benefit of the heat transfer method of the present disclosure.

PCB Assembly to Internal Enclosure Air—A portion of the heat from the heat generating components mounted on PCB assemblies 203 and 201, and the resulting heat transferred to the PCB structure, is transferred to the air inside the enclosure 100, which transfers its heat to the heat transfer band 104, and ultimately to the external surrounding air through convection. It should be noted that fan 205 can be turned on to make the temperature distribution within the enclosure more uniform, thereby ensuring that a maximum amount of surface area of heat transfer band 104 is exposed to the heat content of the air inside enclosure. As can be seen in FIGS. 2 and 3, fan 205 is positioned in such a way as to blow air across the top and bottom surfaces of PCB assemblies 203 and 301. IN some embodiments plural fans may be provided without departing from the scope of the present disclosure.

LCD to Heat Transfer Band—A similar method to transfer heat to the internal air of the enclosure, as described above, applies to the heat generated by LCD 305, so it won't be repeated here.

With reference to FIG. 3a, LCD 305 is attached to LCD mounting plate 403 by means of fasteners located on flanges 403b of FIG. 4. The material of LCD mounting plate 403 is typically anodized aluminum, but may be made out of other thermally conductive materials as well. Thermally conductive gasket 305a is applied between the abutting surfaces of the rear of LCD 305 and the top side of LCD mounting plate 403. Because the thermally conductive gasket material is generally expensive, its surface area is sized only to meet the heat transfer requirements of this portion of the enclosure assembly.

The heat transferred from LCD 305 is coupled to heat transfer band 104 by securely fastening LCD mounting plate 403 to compression blocks 201, described earlier, by means of fasteners 201a of FIG. 3a inserted to holes 403a of FIG. 4. As can be seen in FIG. 2, the top of compression blocks 201 provide fastener holes 201b for mounting LCD mounting plate 403. A thermally conductive gasket (not shown) is installed between the overlapping surfaces of LCD mounting plate 403 and compression blocks 201.

It should be noted that the preferred embodiment of the present disclosure, LCD mounting plate 403 is mounted on the opposite side of heat transfer band assembly 200 shown in FIG. 2. The explanation above still holds true.

The abutment relationships starting with the heat source and forming said heat transfer coupling path are: from LCD 305 through thermally conductive gasket 305a to LCD mounting plate 403; from LCD mounting plate 403 through a thermally conductive gasket (not shown) to compression blocks 201; from compression blocks 201 through a further thermally conductive gasket (not shown) to PCB assembly 301; and from PCB assembly 301 through thermally conductive gasket 201c to heat transfer band 104.

It should be noted that LCD mounting plate 403 may also be mounted directly to heat transfer belt 104 with or without a thermally conductive gasket, or grease (e.g. 201c), the benefit of which would be improved thermal coupling due to the absence of the PCB in the heat conduction path. Furthermore, it is contemplated that the function of compression blocks 201 may instead be achieved by incorporating said function into LCD mounting plate 403, or some other fabricated part, in order to achieve the same said benefit and the additional benefits of minimization of parts and the simplification of the assembly.

Enclosure Ruggedness

With reference to FIG. 9, the ruggedness of enclosure 900 is enhanced by bumper system 102a through 102f in conjunction with strong enclosure wall materials consisting of metal heat transfer band 104 sandwiched between enclosure front 307 and the enclosure rear 308.

The material used for the bumpers is a synthetic rubber; however, any material that sufficiently absorbs shock without being damaged and meets the other environmental conditions (such as operating temperature range, chemical resistance, ultraviolet resistance, etc.) may be used. It should be noted that the bumper will compress and deform to some degree during the impact event; therefore, the dimensions of the bumpers must take this into account to prevent the protected enclosure surfaces from touching an planar impact surface.

More specifically, exemplary FIGS. 10 and 11 depict the front, right side and rear views of the shock protection system. The methods described above for FIGS. 10 and 11 below apply to all sides of the enclosure, including the sides that are not shown, even though the geometry and features may differ to some degree.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An enclosed electronic apparatus comprising:
   an enclosure having an exterior surface;
   a first continuous heat-transfer band forming at least a portion of the exterior surface of the enclosure, the first continuous heat-transfer band having first and second substantially continuous lateral edges on either side thereof, and one or more mounting points on an internal side of the continuous heat transfer band;
   at least one printed circuit board assembly mounted to the heat transfer band at the one or more mounting points, the printed circuit board assembly including at least one thermally conductive portion forming a thermal path between a heat-producing electronic component of the printed circuit board assembly and the heat transfer band;
   a first enclosure portion sealing a first continuous lateral edge of the heat transfer band against penetration of fluid or debris; and
   a second enclosure portion sealing a second continuous lateral edge of the heat transfer band against penetration of fluid or debris.

2. The enclosed electronic apparatus according to claim 1, further comprising
   a second continuous heat-transfer band forming at least a portion of the exterior surface of the enclosure, having first and second continuous lateral edges on either side thereof,
   wherein the second continuous heat-transfer band is interposed between first continuous heat-transfer band at the respective continuous lateral edges on a first lateral side thereof, and either a first enclosure or a second enclosure on a second lateral side thereof.

3. The enclosed electronic apparatus according to claim 2, further comprising
   a third enclosure portion forming at least a portion of the exterior surface of the enclosure, and sealingly interposed between the first and second continuous heat transfer bands at their respective continuous lateral edges.

4. The enclosed electronic apparatus according to claim 1, further comprising
   a fan for circulating a coolant fluid over the surface of the at least one printed circuit board assembly within the enclosed electronic apparatus.

5. The enclosed electronic apparatus according to claim 1, wherein
   the at least one printed circuit board assembly comprises a plurality of printed circuit board assemblies, each mounted to the first continuous heat transfer band in a generally continuous plane.

6. The enclosed electronic apparatus according to claim 1, wherein
   the at least one printed circuit board assembly comprises a plurality of printed circuit board assemblies, each mounted to the first continuous heat transfer band in respective offset planes.

7. The enclosed electronic apparatus according to claim 1, further comprising
   a display opening in one of the first enclosure portion and the second enclosure portion;
   a transparent window sealingly covering the display opening; and
   a user interface display mounted within the enclosed electronic apparatus being viewable through the transparent window.

8. The enclosed electronic apparatus according to claim 7, wherein
   a thermally conductive user interface mounting bracket that secures the user interface display to the first continuous heat transfer band and provides a thermally conductive path between the user interface bracket and the first continuous heat transfer band.

9. The enclosed electronic apparatus according to claim 8, further comprising
   a first thermally conductive gasket in contact with the user interface mounting bracket and the user interface display; and
   a second thermally conductive gasket in contact with the user interface mounting bracket and the first continuous heat transfer band.

10. The enclosed electronic apparatus according to claim 1, further comprising
    a compartment formed in one of the first enclosure portion and the second enclosure portion having an opening to an exterior thereof;
    an access door selectively permitting access to the compartment;
    a continuous gasket surrounding the opening and sealing the opening between the door and the first enclosure portion or second enclosure portion surrounding the opening to seal the opening against penetration of fluid or debris; and
    a fastener operative to hold the access door in a closed position.

11. The enclosed electronic apparatus according to claim 1, further comprising
    a plurality of shock resisting bumpers secured to an exterior of the electronic apparatus whereby a linear surface between any two adjacent shock resisting bumpers would contact only said bumpers, and not any other part of the enclosed electronic apparatus.

12. The enclosed electronic apparatus according to claim 11, wherein
    the enclosed electronic apparatus is generally the shape of a rectangular parallelepiped; and
    the plurality of shock resisting bumpers are positioned to cover at least eight corners of the rectangular parallelepiped.

13. The enclosed electronic apparatus according to claim 10, further comprising
    the compartment extends in a generally rectangular protrusion above the surface of the respective first enclosure portion or second enclosure portion; and
    a plurality of shock resisting bumpers is positioned to cover at least the four corners of the rectangular protrusion.

14. The enclosed electronic apparatus according to claim 1, further comprising a heat conducting covering in thermal contact with an exposed surface of a heat generating component of the printed circuit board assembly; and the heat conductive covering being connected in at least one location to the continuous heat transfer band thereby forming a thermal path between the heat producing electronic component and the continuous heat transfer band.

15. The enclosed electronic apparatus according to claim 14, further comprising one or more of a thermal gasket and a thermal grease interposed between the heat conductive covering and the heat generating component.

16. The enclosed electronic apparatus according to claim 1, wherein the printed circuit board assembly comprises a printed circuit board; and the at least one thermally conductive portion forming the thermal path between the heat-producing electronic component of the printed circuit board assembly and the heat transfer band comprises a thermally conductive internal layer within the surface of the printed circuit board.

17. The enclosed electronic apparatus according to claim 1, further comprising one or more thermally conductive regions generally on a perimeter of the printed circuit board assembly in thermal communication with the at least one thermally conductive portion forming the thermal path between the heat-producing electronic component of the printed circuit board assembly and the heat transfer band; and one or more thermally conductive interior regions generally on an interior of the printed circuit board assembly in thermal communication with the at least one thermally conductive portion forming the thermal path between the heat-producing electronic component of the printed circuit board assembly and the heat transfer band.

18. The enclosed electronic apparatus according to claim 1, further comprising a plurality of thermally conductive regions on opposing sides of the printed circuit board assembly.

19. The enclosed electronic apparatus according to claim 1, further comprising a communication access opening in the heat transfer band;

a communication access door selectively permitting access to the communication access opening;

a continuous gasket surrounding the communication access opening and sealing the communication access opening between the communication access door and the first enclosure portion or second enclosure portion surrounding the communication access opening to seal the communication access opening against penetration of fluid or debris; and a fastener operative to hold the communication access door in a closed position.

20. The enclosed electronic apparatus according to claim 1, further comprising a rubberized carrying handle.

21. The enclosed electronic apparatus according to claim 1, further comprising a thermally conductive gasket between the printed circuit board assembly and the heat transfer band at the one or more mounting points.

22. The enclosed electronic apparatus according to claim 1, further comprising a plurality of thermal fins on an exterior surface of the first continuous heat-transfer band.

* * * * *